(12) United States Patent  
Tsubosaki

(10) Patent No.: US 6,906,429 B2  
(45) Date of Patent: Jun. 14, 2005

(54) SEMICONDUCTOR DEVICE AND METHOD OF FABRICATING THE SAME

(75) Inventor: Kunihiro Tsubosaki, Shinjuku-Ku (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 10/619,551

(22) Filed: Jul. 16, 2003

(65) Prior Publication Data

US 2005/0073049 A1 Apr. 7, 2005

(30) Foreign Application Priority Data

Jul. 17, 2002 (JP) ......................................... 2002-207632

(51) Int. Cl.[7] .............................................. H01L 23/48
(52) U.S. Cl. ........................ 257/780; 257/781; 257/782; 257/738; 257/751
(58) Field of Search ................................ 257/780, 781, 257/782, 738, 751

(56) References Cited

U.S. PATENT DOCUMENTS

| 5,016,087 | A | * | 5/1991 | Haug et al. ................. 257/750 |
| 5,023,697 | A | * | 6/1991 | Tsumura ..................... 257/780 |
| 5,045,151 | A | * | 9/1991 | Edell .......................... 257/622 |
| 5,229,646 | A | * | 7/1993 | Tsumura ..................... 257/782 |
| 5,430,329 | A | * | 7/1995 | Harada et al. .............. 257/786 |
| 5,525,839 | A | * | 6/1996 | Shu ............................ 257/780 |
| 5,726,500 | A | * | 3/1998 | Duboz et al. ............... 257/777 |
| 5,898,223 | A | * | 4/1999 | Frye et al. .................. 257/777 |
| 6,147,413 | A | * | 11/2000 | Farnworth .................. 257/779 |
| 6,441,487 | B2 | * | 8/2002 | Elenius et al. ............. 257/738 |
| 6,492,200 | B1 | * | 12/2002 | Park et al. .................. 438/113 |
| 6,559,540 | B2 | * | 5/2003 | Kawashima ................ 257/737 |

* cited by examiner

Primary Examiner—Jasmine Clark  
(74) Attorney, Agent, or Firm—Parkhurst & Wendel, L.L.P.

(57) ABSTRACT

A semiconductor device comprises a semiconductor IC chip provided with electrode pads, and an insulating layer formed on a surface of the semiconductor IC chip, on the side of the electrode pads. Connecting terminals on the outer surface of the insulating layer and the electrode pads are connected by conductive posts. The insulating layer is formed of an insulating elastic material, and the conductive posts are formed of a conductive elastic material.

11 Claims, 6 Drawing Sheets

SEMICONDUCTOR DEVICE AND METHOD OF FABRICATING THE SAME

TECHNICAL FIELD

The present invention relates to a semiconductor device and a method of fabricating the same. More specifically, the present invention relates to a semiconductor device provided with connecting terminals arranged on the side of a surface on which electrode pads of a semiconductor chip are formed, and a method of fabricating such a semiconductor device.

BACKGROUND ART

As represented by large-scale ASICs, the number of components per IC device, the functional complexity of IC devices and the miniaturization of IC devices have increasingly progressed in recent years to cope with the functional advancement and dimensional reduction of electronic devices.

The back surface of a wafer processed by semiconductor device fabricating processes is polished, and then the wafer is subjected to a dicing process to cut the wafer into pellets (referred to as "chips" or "IC chips"). The pellets are subjected to die bonding, wire bonding and packaging to fabricate a semiconductor device. The IC chip is electrically connected to a lead frame by a wire-bonding process.

Flip-chip bonding using bumps on IC chips has become prevalent in recent years. Flip-chip bonding is superior to wire bonding in respect of high-speed signal processing.

Flip-chip bonding is practiced in fabricating a nonpackaged bear-chip mount device having a bear IC chip mounted on a printed wiring board. It is difficult to handle such a bear-chip mount device. From the viewpoint of ensuring reliability, semiconductor IC packages with bumps are manufactured.

A method of fabricating chip-scale packages (CSPs), i.e., semiconductor IC packages with bumps, was recently proposed in "Chip Scale International 99", SEM1, 1999. Specifically wiring lines and terminals (metal posts) are disposed on a wafer on which ICs are formed, the wafer is sealed in a resin to form a packaged wafer, bumps are formed on the packaged wafer, and the packaged wafer is cut into chip-scale packages, i.e., semiconductor IC packages.

A CSP thus fabricated is also called a wafer-level CSP (W-CSP).

A semiconductor device fabricated by such a semiconductor device fabricating method includes a semiconductor IC chip, metal posts formed on the semiconductor IC chip, a resin package packaging the semiconductor IC chip, and solder balls connected to the metal posts. The diameter of the metal post in the range of 100 to 200 $\mu$m must be about two-thirds the diameter of the solder balls, and the height of the metal posts is about 100 $\mu$m. Since the metal posts are thick and rigid, the resin package surrounding the metal posts is rigid. Thus, the metal posts are fixed firmly to the semiconductor IC chip.

When the semiconductor IC package (individual semiconductor device) mounted on a wiring board is subjected repeatedly to temperature change, a thermal stress is induced in the semiconductor IC package due to the difference $\Delta\alpha$ in thermal coefficient of expansion between the semiconductor IC package and the wiring board. Consequently, cracks develop in parts of the semiconductor IC chip around the metal posts, and cracks develop in the solder balls due to stress concentration on the joining parts of the metal posts and the solder balls.

The manufacturing cost of the W-CSP is not necessarily low.

The metal posts are formed by electroplating. Several hours are necessary to form the metal posts with a height of about 100 $\mu$m by electroplating, which increases the manufacturing cost. The process of packaging the wafer involves an expensive vacuum packaging apparatus of special construction.

The semiconductor IC package is subjected to burning and electrical characteristic tests. Minute, elastic structures, such as contact pins, are necessary to connect the semiconductor IC package electrically to a burn-in socket and test instruments with reliability for burn-in and electrical characteristic tests. Sockets for such a purpose are expensive.

Thus, it has been desired to develop measures for solving problems relating to the development of cracks in parts of the semiconductor IC chip around the metal posts and in the solder balls when the W-CSP mounted on a wiring board is subjected repeatedly to temperature change, and for reducing the manufacturing cost.

DISCLOSURE OF THE INVENTION

Accordingly, it is an object of the present invention to provide a semiconductor device having a semiconductor IC chip and solder balls which are less liable to be cracked when the semiconductor device is mounted on a wiring board and subjected to temperature change, can be manufactured at a low manufacturing cost, and to provide a method of such a semiconductor device.

According to a first aspect of the present invention, a semiconductor device comprises: a semiconductor IC chip provided with electrode pads; an insulating layer formed on a surface of the semiconductor IC chip on the side of the electrode pads; connecting terminals on an outer surface of the insulating layer; and conductive posts extending through the insulating layer and connecting the electrode pads of the semiconductor IC chip to the connecting terminals; wherein the insulating layer is formed of an insulating elastic material.

In the semiconductor device according to the present invention, the conductive posts are formed of a conductive elastic material.

In the semiconductor device according to the present invention, the conductive elastic material of the conductive posts contains a synthetic rubber and conductive particles dispersed in the synthetic rubber.

In the semiconductor device according to the present invention, the conductive elastic material forming the conductive posts is a composite paste containing an addition-polymerized silicone rubber, and 70% by weight or above Ag particles dispersed in the addition-polymerized silicone rubber, and the composite paste as cured has a volume resistivity of $5\times10^{-3}$ $\Omega$·cm or below.

In the semiconductor device according to the present invention, a wiring layer is formed between the electrode pads of the semiconductor IC chip and the conductive posts.

In the semiconductor device according to the present invention, wiring parts are formed between the connecting terminals and the conductive posts.

In the semiconductor device according to the present invention, the connecting terminals are solder balls.

In the semiconductor device according to the present invention, a barrier metal layer is provided between the solder balls and the conductive posts.

In the semiconductor device according to the present invention, the insulating elastic material of the insulating layer is any one of silicone rubbers, fluororubbers, polyurethane rubbers, polybutadiene rubbers, acrylonitrilebutadiene copolymers and polyisoprene rubbers, and has an elastic modulus of 100 MPa or below.

In the semiconductor device according to the present invention, the outer surface of the insulating layer of the insulating elastic material is coated with a protective layer, and parts of the connecting terminals lie at positions on the protective layer.

In the semiconductor device according to the present invention, the protective layer is formed of a polyimide resin, a liquid crystalline polymer or an epoxy solder resist.

In the semiconductor device according to the present invention, the semiconductor device is a W-CSP produced by cutting a wafer with a plurality of semiconductor IC chips.

According to a second aspect of the present invention, a semiconductor device fabricating method comprises the steps of: preparing a wafer including a plurality of semiconductor IC chips provided with electrode pads; forming an insulating layer of an insulating elastic material on a surface of the wafer on the side of the electrode pads of the semiconductor IC chips; forming blind vias through the insulating layer; forming conductive posts connected to the electrode pads by filling the blind vias with a conductive paste and curing the conductive paste in the blind vias; providing connecting terminals connecting to the conductive posts; and dicing the wafer for dividing the wafer into individual semiconductor devices.

The semiconductor device fabricating method according to the present invention further comprises the step of forming a wiring layer on the semiconductor IC chips so as to be connected to the electrode pads, wherein a metal layer is formed on the insulating layer of the insulating elastic material, the blind vias are formed through the insulating layer and the metal layer, and a wiring part is formed from the metal layer so as to connect the conductive post and the connecting terminals.

According to a third aspect of the present invention, a semiconductor device fabricating method comprises the steps of: preparing a wafer including a plurality of semiconductor IC chips provided with electrode pads; forming a layered structure consisting of an insulating layer of an insulating elastic material, an insulating protective layer and a metal layer on a surface of the wafer, on the side of the electrode pads of the semiconductor IC chips; forming blind vias through the layered structure; forming conductive posts connected to the electrode pads by filling the blind vias with a conductive paste and curing the conductive paste in the blind vias; forming a wiring part connected to the conductive posts from the metal layer of the layered structure; providing connecting terminals connecting to the wiring part; and dicing the wafer for dividing the wafer into individual semiconductor devices.

In the semiconductor device fabricating method according to the present invention, the conductive paste of the conductive posts is a conductive, elastic rubber.

In the semiconductor device fabricating method according to the present invention, the step of forming the wiring part connecting to the connecting terminals from the metal layer, includes the steps of: forming a resist film provided with openings on the metal layer; forming a Ni layer and a Au layer in that order or a Cu layer, a Ni layer and a Au layer in that order by plating in the openings; and removing the resist film and etching exposed parts of the metal layer.

According to the present invention, cracks do not develop in the semiconductor IC chip of the W-CSP and cracks develop scarcely in the solder balls of the semiconductor IC chip of the W-CSP when the W-CSP mounted on a wiring board is exposed to temperature change. The W-CSP of the present invention can be manufactured at a low manufacturing cost.

Since the W-CSP of the present invention has the conductive posts formed of an elastic material and extending through the insulating layer formed of an insulating elastic material, the insulating layer and the conductive posts are combined integrally and are able to deform elastically. When the W-CSP is mounted on a wiring board, the W-CSP of the present invention is more capable of absorbing thermal stresses resulting from the difference in thermal coefficient of expansion between the wiring board and the semiconductor IC chip than the conventional W-CSP. Thus, the W-CSP of the present invention withstands cyclic thermal shocks and improves reliability in connection.

Since the conductive posts of the W-CSP of the present invention are connected through the barrier metal layer to the solder balls, or through the metal layer and the barrier metal layer to the solder balls, the solder balls are resistant to a force acting thereon in a direction perpendicular to the surface of the W-CSP.

The conductive elastic material may be produced by dispersing conductive particles in a synthetic rubber. More concretely, the conductive elastic material is a composite paste containing an addition-polymerized silicone rubber, and 70% by weight Ag particles dispersed in the addition-polymerized silicone rubber, and the composite paste as cured has a volume resistivity of $5 \times 10^{-3} \Omega \cdot cm$ or below.

In the W-CSP, the possibility of two-dimensionally discretely forming the conductive posts of the elastic material is particularly effective.

In the W-CSP of the present invention, the protective film is formed on the insulating layer of the elastic material, and at least parts of the connecting terminals lie on the protective film. Therefore, in a process of mounting the W-CSP on a wiring board with the solder balls joined to terminals on the wiring board, the insulating layer of the elastic material is protected from chemicals, the strength of joints of the connecting terminals and the terminals of the wiring board can be enhanced, and reliability can be improved.

In the W-CSP fabricated by the W-CSP fabricating method of the present invention, cracks do not develop in the semiconductor IC chip of the W-CSP and cracks develop scarcely in the solder balls of the semiconductor IC chip when the W-CSP mounted on a wiring board is exposed to temperature change. The W-CSP of the present invention can be manufactured at a low manufacturing cost.

BEST MODE FOR CARRYING OUT THE INVENTION

Figure 1A:
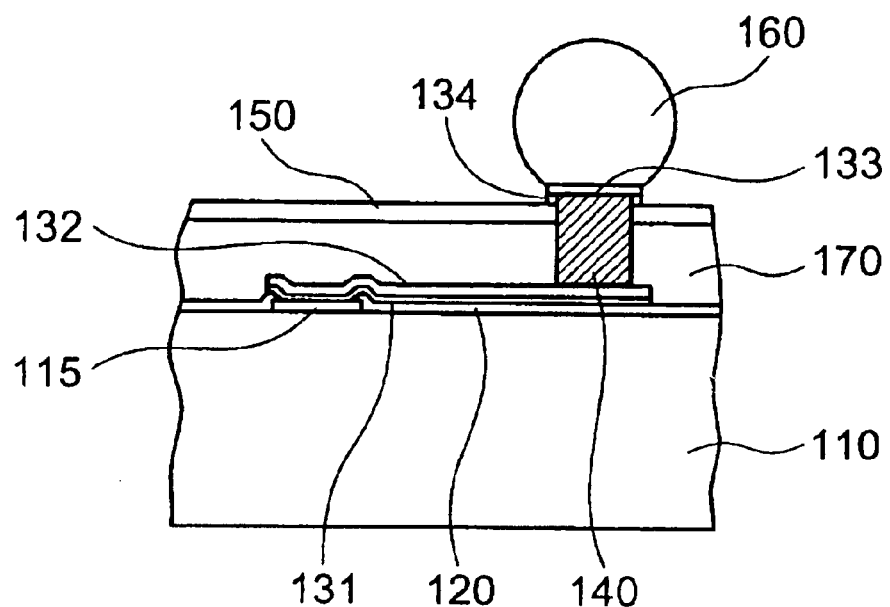
FIG. 1A is a partly sectional side elevation of a W-CSP in a first embodiment according to the present invention.
Figure 1B:
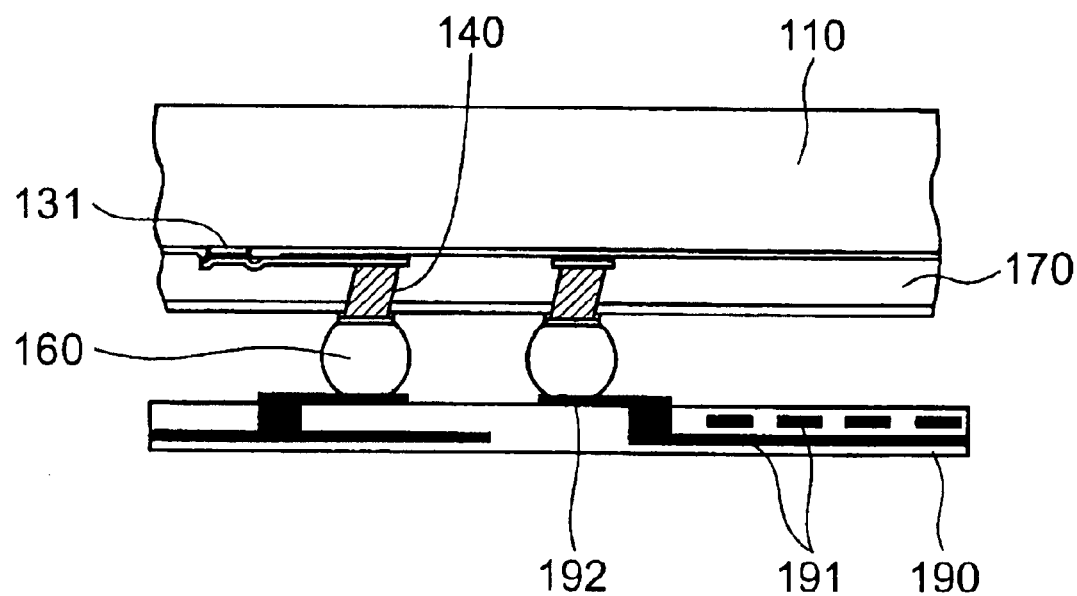
FIG. 1B is a partly sectional side elevation of the W-CSP as mounted on a wiring board.
Figure 2:
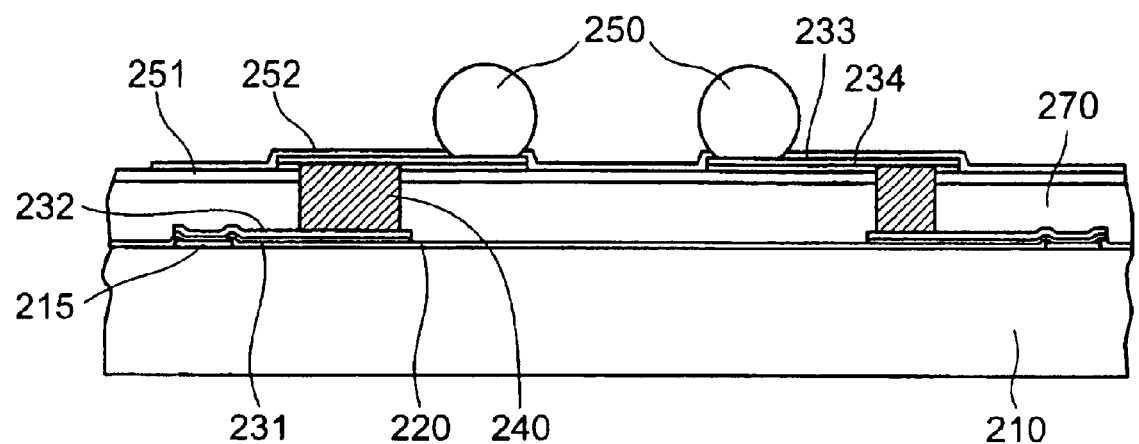
FIG. 2 is a partly sectional side elevation of a W-CSP in a second embodiment according to the present invention.
Figure 3:
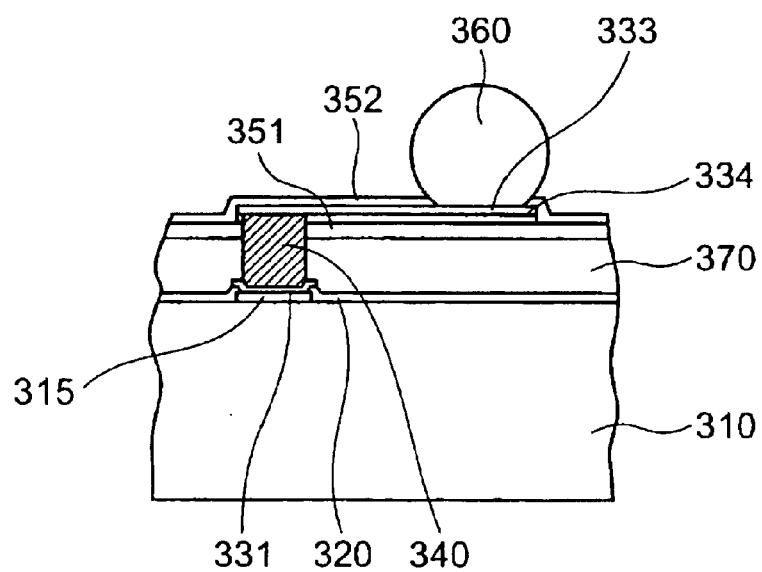
FIG. 3 is a partly sectional side elevation of a W-CSP in a third embodiment according to the present invention.
Figure 4:
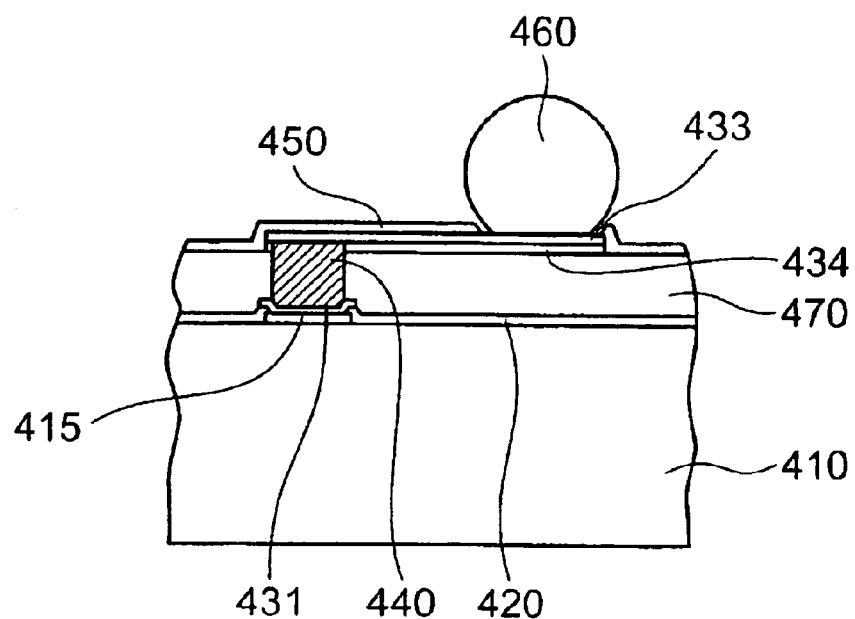
FIG. 4 is a partly sectional side elevation of a W-CSP in a fourth embodiment according to the present invention.
Figure 5:
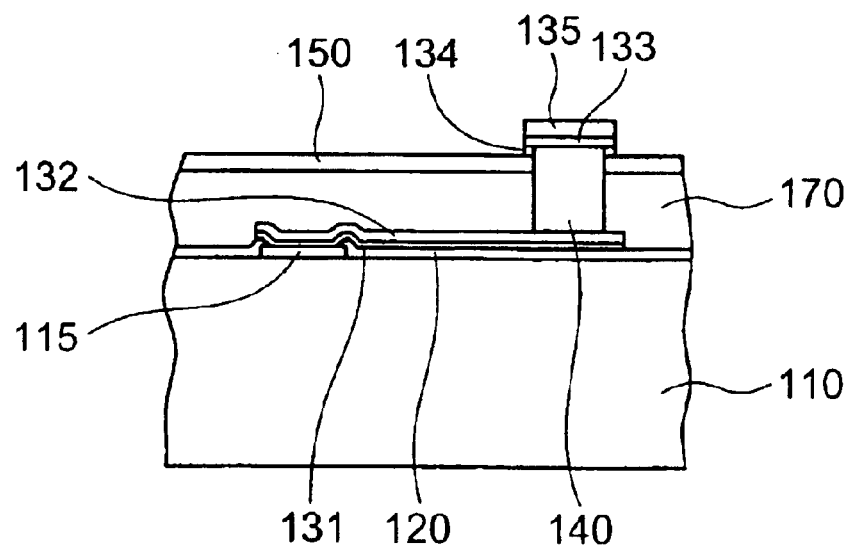
FIG. 5 is a partly sectional view of a W-CSP in a modification of the W-CSP shown in FIG. 1A.

FIG. 1A is a partly sectional side elevation of a W-CSP in a first embodiment according to the present invention, FIG. 1B is a partly sectional side elevation of the W-CSP as mounted on a wiring board, FIG. 2 is a partly sectional side elevation of a W-CSP in a second embodiment according to the present invention, FIG. 3 is a partly sectional side elevation of a W-CSP in a third embodiment according to the present invention, FIG. 4 is a partly sectional side elevation of a W-CSP in a fourth embodiment according to the present invention, FIG. 5 is a partly sectional view of a W-CSP in a modification of the W-CSP shown in FIG. 1A, FIG. 6 is sectional views of a workpiece in various conditions in the steps of a semiconductor device fabricating method of fabricating the W-CSP in the first embodiment shown in FIG. 1A, FIG. 7 is sectional views of a workpiece in various conditions in the steps of a semiconductor device fabricating method of fabricating the W-CSP in the fourth embodiment shown in FIG. 4, and FIG. 8 is views of assistance in explaining a W-CSP in a comparative example.

Shown in FIGS. 1 to 7 are a semiconductor IC chip 110, electrode pads (referred to also as "electrodes" or "pads") 115, a protective layer (passivation film) 120, metal layers 131, 132, 133 and 134, plated solder layer 135, conductive posts 140, blind vias 145, a protective layer 150, solder balls 160, an insulating layer 170, a wiring board 190, wiring lines 191, terminals 192, a semiconductor IC chip 210, electrode pads (referred to also as "electrodes" or "pads") 215, a protective layer (passivation film) 220, metal layers 231, 232, 233 and 234, conductive posts 240, protective layers 251 and 252, solder balls 260, an insulating layer 270, a semiconductor IC chip 310, electrode pads (referred to also as "electrodes" or "pads") 315, a protective layer (passivation film) 320, metal layers 331, 333 and 334, conductive posts 340, protective layers 351 and 352, solder balls 360, an insulating layer 370, a semiconductor IC chip 410, electrode pads (referred to also as "electrodes" or "terminals") 415, a protective layer (passivation film) 420, metal layers 431, 433 and 434, conducive posts 440, blind vias 445, a protective layer 450, solder balls 460 and an insulating layer 470.

The W-CSP in the first embodiment will be described with reference to FIGS. 1A and 1B.

The W-CSP has the semiconductor IC chip 110 provided with the electrode pads 115, the insulating layer 170 covering a surface of the semiconductor IC chip 110, provided with the electrode pads 115, the conductive posts 140 penetrating the insulating layer 170 in the direction of the thickness, and the solder balls (connecting terminals) 160 connected to the conductive posts 140.

The insulating layer 170 is formed on the surface of the semiconductor IC chip 110, provided with the electrode pads 115, and the conductive posts 140 penetrating the insulating layer 170 are spaced from the electrode pads 115. The solder balls 160, i.e., the connecting terminals disposed outside the insulating layer 170, and the electrode pads 115 are connected electrically by a wiring layer consisting of the metal layers 131 and 132 formed on the protective film (passivation film) 120 formed on a surface of the semiconductor IC chip 110, on the side of the insulating layer 170, and the conductive posts.

The insulating layer 170 is formed of an insulating elastic material, and the conductive posts 140 are formed of a conductive elastic material.

The solder balls 160 are connected to a metal layer 133 serving as a barrier layer formed on the outer ends of the conductive posts 140.

Preferably, the insulating elastic material forming the insulating layer 170 has excellent insulating and adhesive properties, and sufficient mechanical strength. In view of thermal stress relaxation, it is preferable that the insulating elastic material forming the insulating layer 170 is one of silicone rubbers, fluororubbers, polyurethane rubbers, polybutadiene rubbers, acrylonitrile-butadiene copolymers and polyisoprene rubbers, and has an elastic modulus of 100 MPa or below.

The conductive elastic material forming the conductive posts 140 is, for example, a synthetic rubber containing conductive particles dispersed therein. More concretely, the conductive elastic material is a material obtained by curing a composite paste containing an addition-polymerized silicone rubber, and 70% by weight Ag particles dispersed in the addition-polymerized silicone rubber, and having a volume resistivity of $5 \times 10^{-3} \Omega \cdot cm$ or below.

The wiring layer consisting of the metal layers 131 and 132 is formed by forming the metal layer 131 as a shielding metal layer, such as a Cr—Cu or Ti—W layer formed by sputtering, and forming the metal layer 132 on the metal layer 131 by electroplating.

The metal layer 132 is the principal layer of the wiring layer and is formed, in most cases, of a material containing Cu as a principal component in view of conductivity and cost. However, there is not any particular restriction on the material of the metal layer 132.

The metal layer 133 is formed to allow currents to flow against a low resistance from the conductive posts 140 to the solder balls 160 and to prevent excessive diffusion between the solder balls 160 and the metal layer 134. For example, the metal layer 133 is a barrier metal layer formed by depositing a 10 $\mu$m thick Ni layer by plating, and a 0.1 $\mu$m thick Au layer by plating in that order on the conductive posts 140 and the metal layer 134.

The protective layer 150 is formed of a polyimide resin or a liquid crystalline polymer.

Generally, the electrode pads 115 of the semiconductor IC chip 110 are Al electrodes, and the protective layer (passivation film) 120 is a SiN film or a composite film consisting of a SiN film and a polyimide resin film.

When the W-CSP in the first embodiment mounted on the wiring board 190 is subjected to a thermal shock test, the conductive posts 140 formed of the elastic material and the insulating layer 170 formed of the elastic material deform so as to absorb a thermal deformation which may otherwise be developed in the semiconductor IC chip 110 due to the difference in thermal properties between the wiring board 190 and the semiconductor IC chip 110.

Consequently, high stress is not induced in parts of the semiconductor IC chip 110 around the conductive posts, and the solder balls 160, and hence cracks will not develop in the semiconductor IC chip 110 and the solder balls 160.

FIG. 8 shows a semiconductor device as a comparative example.

Shown in FIG. 8 are a semiconductor IC chip (referred to also simply as "chip" or "semiconductor element") 510, electrode pads 515, a protective film (SiN passivation film or a polyimide resin layer) 520, metal layers 531 and 532 (the metal layers 531 and 531 are a shielding metal layer and an electroplated Cu layer, respectively), posts 540, i.e., electroplated Cu layers also called outer terminals or metal posts, solder balls (referred to also as "connecting terminals") 560, a sealing resin layer (epoxy resin layer) 570, in-chip cracks 580 developed in the semiconductor chip 510, in-ball cracks 585 developed in solder balls 560, a wiring board 590, a wiring layer 591 and pads 592.

The electrode pads 515 of the semiconductor IC chip 510 in this CSP are connected through the metal layers 531 and 532 formed on a surface of the semiconductor IC chip 510 to the two-dimensionally arranged outer terminals (metal posts) 540. The outer terminals (metal posts) 540 are connected to the solder balls 560. The solder balls 560 are bumps to be soldered to terminals of a printed wiring board.

The metal posts 540 are sealed in the sealing resin layer 570.

Figure 8A:
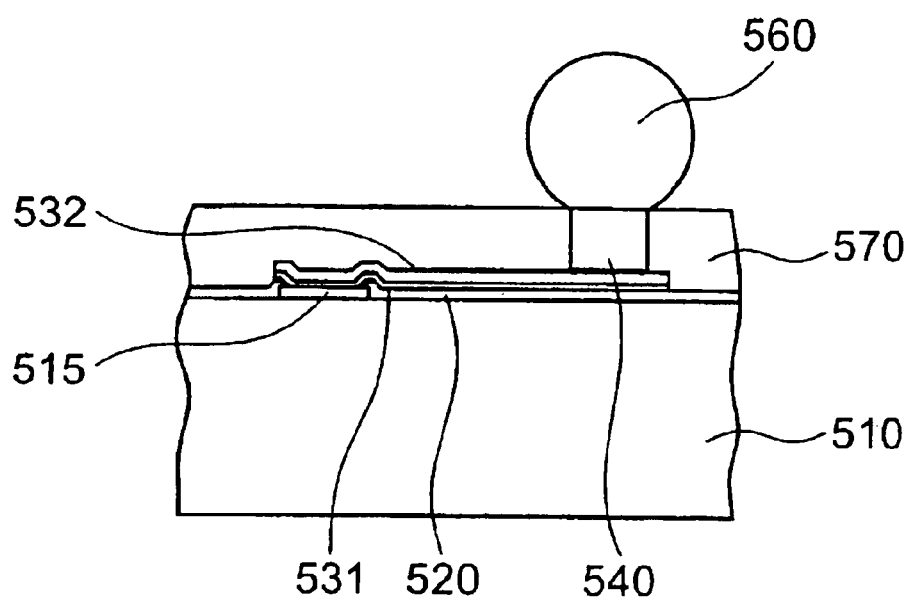
FIGS. 8A and 8B are views of assistance in explaining a W-CSP in a comparative example.
Figure 8B:
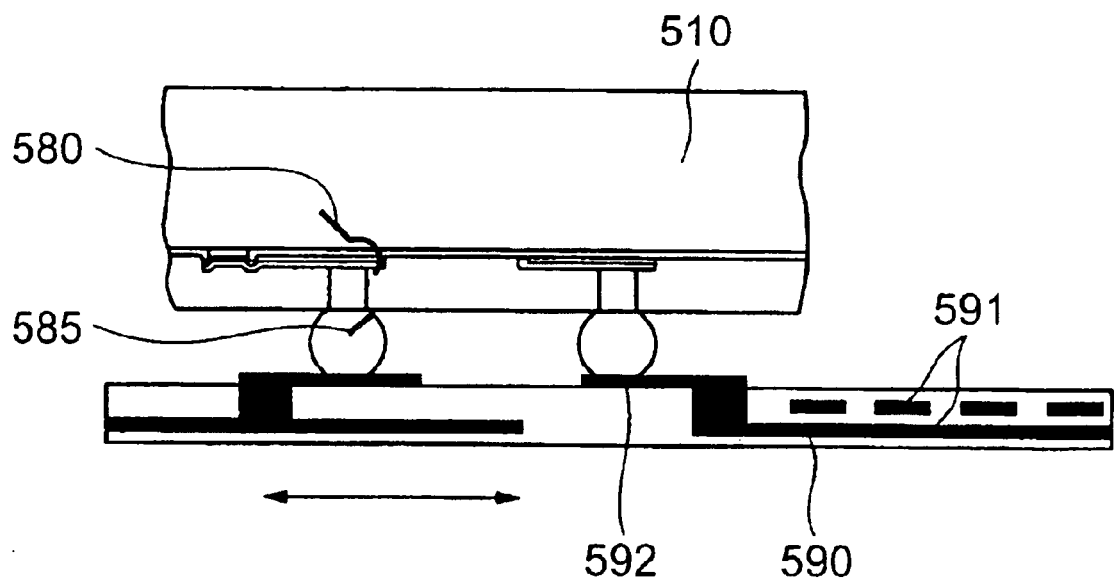

Both the metal posts 540 and the sealing resin layer 570 of the semiconductor device shown in FIGS. 8A and 8B are very rigid. Therefore, it is possible that temperature change causes parts, around lower parts of the metal posts 540, of the chip 510 and the solder balls 560 to crack.

Meanwhile, cracks do not develop in the semiconductor IC chip 110 and the solder balls 160 of the W-CSP of the present invention when the W-CSP undergoes temperature change.

A W-CSP in a second embodiment according to the present invention will be described with reference to FIG. 2. In the W-CSP in toe second embodiment, the conductive posts 240 penetrating the insulating layer 270 formed on a surface of the semiconductor IC chip 210 are spaced some distance apart from the corresponding electrode pads 215. The solder balls 260, i.e., connecting terminals, arranged on the outer surface of the insulating layer 270 are connected electrically to the electrode pads 215 through a wiring layer consisting of the metal layers 231 and 232 and formed on a surface of the insulating layer 270, on the side of the semiconductor IC chip 210, the conductive posts 240 connected to the wiring layer consisting of the metal layers 231 and 232, and a wiring layer consisting of the metal layers 233 and 234 formed on the outer surface of the insulating layer 270 and connected to the conductive posts 240. The insulating layer 270 is formed of an insulating elastic material, and the conductive post 240 are formed of a conductive elastic material.

The solder balls 260 are connected to the wiring layer consisting of the metal layers 233 and 234 by a barrier metal layer, not shown, at positions apart from the conductive posts 240. The rest of the components of the W-CSP in the second embodiment are the same as those of the W-CSP in the first embodiment and hence the description thereof will be omitted.

Basically, the performance of the W-CSP in the second embodiment as mounted on a wiring board in thermal shock tests is similar to that of the W-CSP in the first embodiment; any high stress is not induced in parts of the semiconductor IC chip 210, around the conductive posts 240, and in the solder balls 260. Consequently, semiconductor IC chip 210 and the solder balls 260 are not cracked.

A W-CSP in a third embodiment according to the present invention will be described with reference to FIG. 3. In the W-CSP in the third embodiment, the conductive posts 340 penetrating the insulating layer 370 formed on a surface of the semiconductor IC chip 310 correspond directly to the electrode pads 315. The solder balls 360, i.e., connecting terminals, arranged on the outer surface of the insulating layer 370 are connected electrically to the electrode pads 315 through a wiring layer consisting of the metal layers 333 and 334 and formed on the outer surface of the insulating layer 370 and connected to the conductive posts 340

The insulating layer 370 is formed of an insulating elastic material, and the conductive post 340 are formed of a conductive elastic material.

The solder balls 360 are connected to the wiring layer consisting of the metal layers 333 and 334 by a barrier solder layer, not shown, at positions apart from the conductive posts 340.

The protective layer 351, similarly to those of the first and the second embodiment, are formed of a polyimide resin or a liquid crystalline polymer. The protective film 352 is formed of a polyimide resin or an epoxy solder resist so as to cover the metal layer 333.

The rest of the components of the W-CSP in the third embodiment are the same as those of the W-CSPs in the first and the second embodiment and hence the description thereof will be omitted.

Basically, the performance of the W-CSP in the third embodiment as mounted on a wiring board in thermal shock tests is similar to that of the W-CSPs in the first and the second embodiment; any high stress is not induced in parts of the semiconductor IC chip 310, around the conductive posts 340, and in the solder balls 260. Consequently, semiconductor IC chip 310 and the solder balls 360 are not cracked.

A W-CSP in a fourth embodiment according to the present invention will be described with reference to FIG. 4. The W-CSP in the fourth embodiment is the same in construction as the W-CSP in the third embodiment, except that the W-CSP in the fourth embodiment is not provided with any component corresponding to the protective layer 351 of the W-CSP in the third embodiment.

The rest of the components of the W-CSP in the fourth embodiment are the same as those of the W-CSPs in the third embodiment.

Basically, the performance of the W-CSP in the fourth embodiment as mounted on a wiring board in thermal shock tests is similar to that of the W-CSPs in the first to the third embodiments; any high stress is not induced in parts of the semiconductor IC chip 410, around the conductive posts 440, and in the solder balls 460. Consequently, semiconductor IC chip 410 and the solder balls 460 are not cracked.

W-CSPs in modifications of the W-CSPs in the second to the fourth embodiments are provided with rigid conductive posts instead of the elastic conductive posts 240, 340 and 440.

Although the rigid conductive posts do not deform elastically, thermal stresses can be absorbed because the metal layers 233, 234, 333, 334, 433 and 434 respectively formed on the elastic insulating layers 270, 370 and 470, and the solder balls 260, 360 and 460 respectively arranged on the elastic insulating layers 270, 370 and 470 at positions spaced some distance apart from the conductive posts 240, 340 and 440 are able to move according to the deformation of the elastic insulating layers 270, 370 and 470.

W-CSPs in modifications of the W-CSPs in the first to the fourth embodiments are provided, instead of with the solder balls, with outer terminals formed by plating parts of the metal layer corresponding to the solder balls or printing a solder paste on parts of the metal layer corresponding to the solder balls.

As shown in FIG. 5, a W-CSP in a modification of the W-CSP in the first embodiment is provided with plated solder pads formed by solder-plating the wiring layer consisting of the metal layers 133 and 134 instead of the solder balls.

A semiconductor device fabricating method for fabricating the W-CSP according to the present invention will be described hereinafter.

A semiconductor device fabricating method for fabricating the W-CSP in the first embodiment will be described with reference to FIGS. 6A to 6H.

A wafer preparation process is carried out to obtain a wafer 110a carrying a plurality of semiconductor IC chips 110 and having a surface, on which the electrodes of the semiconductor IC chips 110 are formed, covered with the protective layer (passivation film) 120. The semiconductor IC chips 110 (FIG. 6A) are subjected to the following sequential wafer-level processes.

Figure 6A:
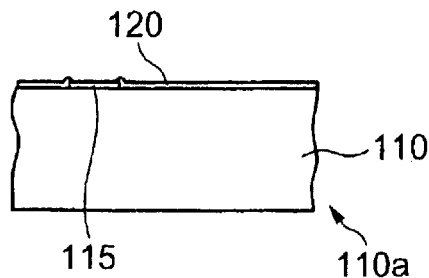
FIGS. 6A to 6H are sectional views of a workpiece in various conditions in the steps of a semiconductor device fabricating method of fabricating the W-CSP in the first embodiment shown in FIG. 1A.
Figure 6B:
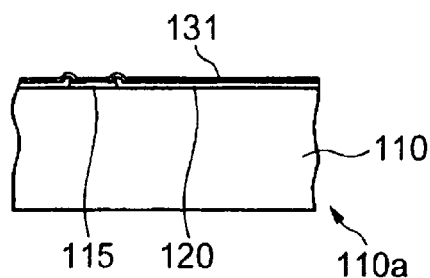
Figure 6C:
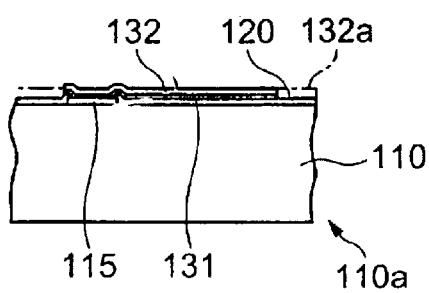

First, the metal layer 131 for the wiring layer is formed so as to cover the protective layer (passivation film) 120 and the electrode pads 115 entirely as shown in FIG. 6B. A resist film 132a having a pattern with openings corresponding to wiring lines is formed on the metal layer 131, and Cu is deposited on parts of the surface of the metal layer 131, corresponding to the openings of the resist film 132a, to form the metal layer 132 of Cu. Then, the resist film 132a is removed, the metal layer 131, excluding parts thereof for forming wiring lines, is etched to form the wiring layer 131, 132 connected to the electrode pads 115 on the protective layer (passivation film) 120 as shown in FIG. 6C.

Figure 6D:
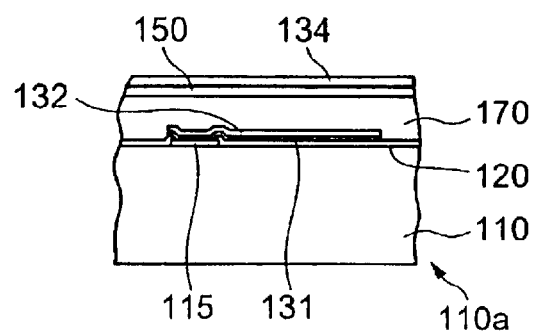

Then, a layered structure is formed by superposing the insulating layer 170 of an adhesive, elastic material, the protective layer 150 and the metal layer 134 in that order from the wafer side, and the insulating layer 170 formed of the adhesive, elastic material is bonded to the wafer 110a by hot-melt lamination as shown in FIG. 6D.

Figure 6E:
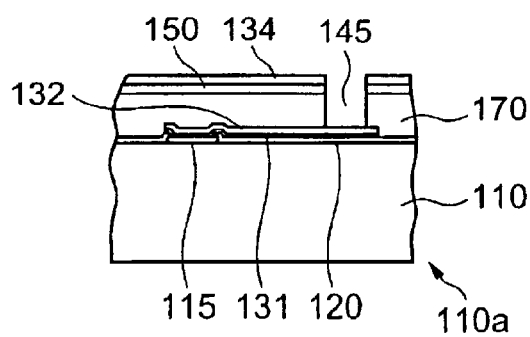

Subsequently, parts of the metal layer 134 of the layered structure, corresponding to the conductive posts 140 are removed by photolithographic etching. Then, blind vias 145 reaching the wiring layer consisting of the metal layers 131 and 132 and formed on the protective layer (passivation film) 120 are formed through the insulating layer 170 and the protective layer 150 by using a $CO_2$ laser, and the interior of the blind vias 145 is cleaned by plasma etching or the like as shown in FIG. 6E.

Figure 6F:
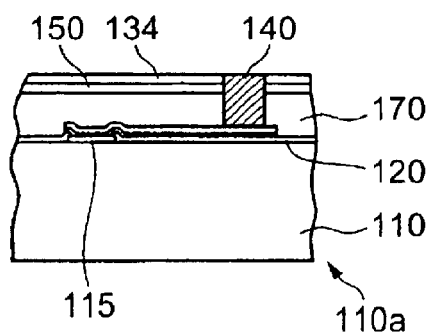

Then, the blind vias 145 are filled up with a conductive paste to form posts, and the posts of the conductive paste are cured. Parts of the posts protruding from the surface of the metal layer 134 are ground and polished flat to complete the conductive posts 140 as shown in FIG. 6F.

Figure 6G:
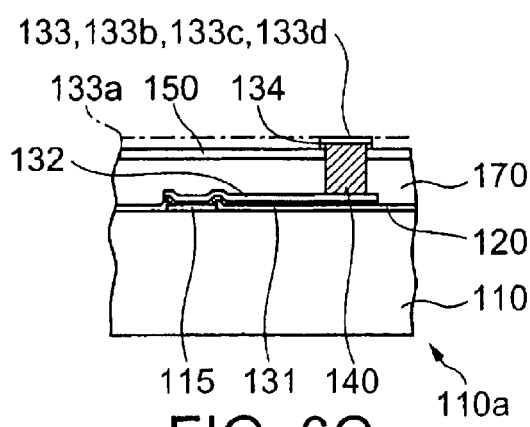

A plating resist film 133a having a pattern with openings corresponding to the conductive posts 140 and outer terminal forming regions around the conductive posts 140 is formed on the metal layer 134, a Ni layer 133b and a Au layer 133c (or a Cu layer 133d, a Ni layer 133b and a Au layer 133c) are formed in that order from the wafer side by electroplating using the plating resist film 133a. Then, the plating resist film 133a is removed, and parts of the metal layers 133 and 134 are removed by etching, using the layered structure consisting of the Ni layer 133b and the Au layer 133c as an etching mask to form terminals consisting of the metal layers 133 and 134 as shown in FIG. 6G.

Figure 6H:
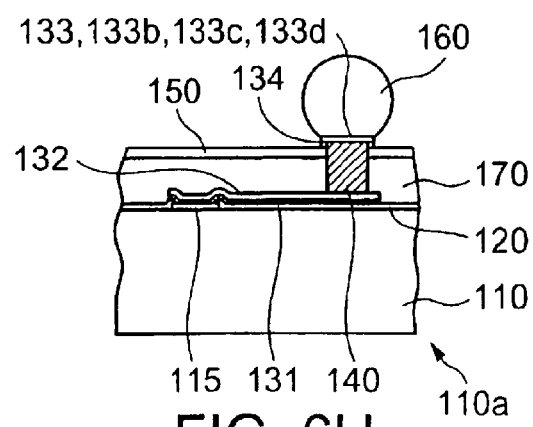

The solder balls 160 are attached to the layered structure consisting of the Ni layer 133b and the Au layer 133c as shown in FIG. 6H.

The solder balls 160 are formed by the combination of a screen-printing method and a reflow soldering method or a bump forming method. Generally, the diameter of the solder balls is in the range of about 0.2 to 0.5 mm.

Subsequently, the wafer 110a is subjected to a dicing process to cut the wafer 110a into individual semiconductor IC chips 110 provided with the solder balls (outer terminals) 160, i.e., W-CSPs.

The W-CSP in the first embodiment is thus fabricated.

A semiconductor device fabricating method for fabricating the W-CSP in the fourth embodiment will be described with reference to FIGS. 7A to 7H.

A wafer preparation process is carried out to obtain a wafer 410a carrying a plurality of semiconductor IC chips 410 and having a surface, on which the electrodes of the semiconductor IC chips 410 are formed, covered with the protective layer (passivation film) 420. The semiconductor IC chips 410 (FIG. 7A) are subjected to the following sequential wafer-level processes.

Figure 7A:
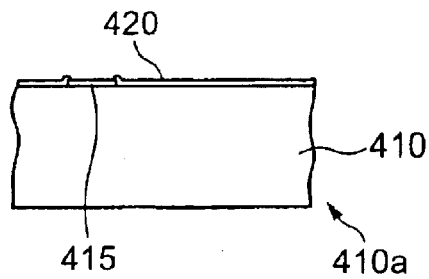
FIGS. 7A to 7H are sectional views of a workpiece in various conditions in the steps of a semiconductor device fabricating method of fabricating the W-CSP in the fourth embodiment shown in FIG. 4.
Figure 7B:
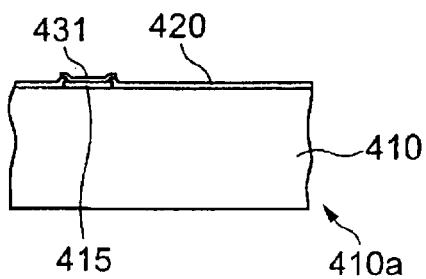

The electrode pads 415 are cleaned by pickling, and the metal layer 431 is formed by zincate treatment, electroless Ni plating and electroless Au plating as shown in FIG. 7B.

Figure 7C:
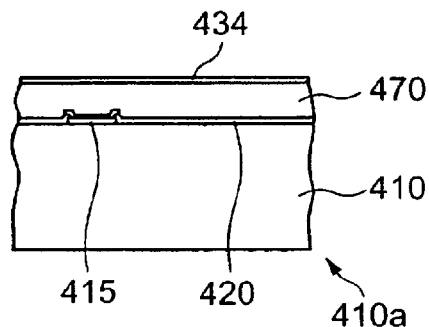

Then, a layered structure is formed by superposing the insulating layer 470 formed of an adhesive elastic material, and the metal layer 434 in that order from the wafer side, and the insulating layer 470 formed of the adhesive, elastic material is bonded to the wafer 410a by hot-melt lamination as shown in FIG. 7C.

Figure 7D:
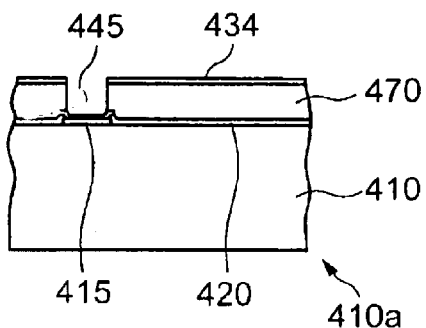

Subsequently, parts of the metal layer 434 of the layered structure, corresponding to the conductive posts 440, are removed by photolithographic etching. Then, blind vias 445 reaching the metal layer 431 are formed through the insulating layer 470 by using a $CO_2$ laser, and the interior of the blind vias 445 is cleaned by plasma etching or the like as shown in FIG. 7D.

Figure 7E:
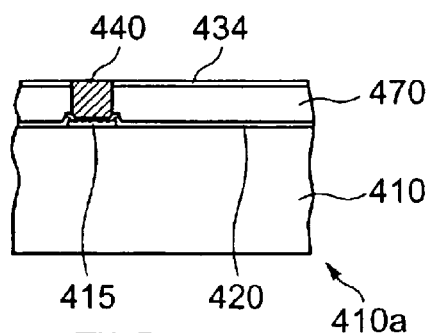

Then, the blind vias 445 are filled up with a conductive paste to form posts, and the posts of the conductive paste are cured. Parts of the posts protruding from the surface of the metal layer 434 are ground and polished flat to complete the conductive posts 440 as shown in FIG. 7E.

Figure 7F:
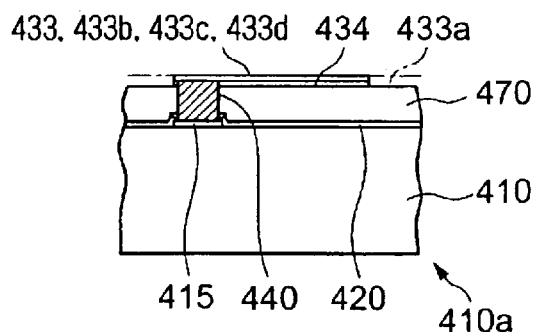

A plating resist film 433a having a pattern with openings corresponding to the conductive posts 440, regions around the conductive posts for forming wiring parts connected to the conductive posts 440 and outer terminal is formed on the metal layer 434. A Ni layer 433b and a Au layer 433c (or a Cu layer 433d, a Ni layer 433b and a Au layer 433c) are formed in that order from the wafer side by electroplating using the plating resist film 433a. Then, the plating resist film 433a is removed, and parts of the metal layer 434 are removed by etching, using the layered structure consisting of the Ni layer 433b and the Au layer 433c as an etching mask to form wiring lines and outer terminals as shown in FIG. 7F.

Figure 7G:
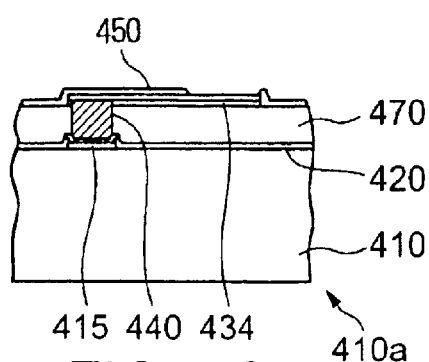

Subsequently, a solder resist film is formed on the surface of the wafer 410a, and the solder resist film is exposed to light through a mask provided with openings corresponding to predetermined regions of the solder resist film. The exposed solder resist film is developed to form the protective layer 450 having openings corresponding to the terminals as shown in FIG. 7G.

Figure 7H:
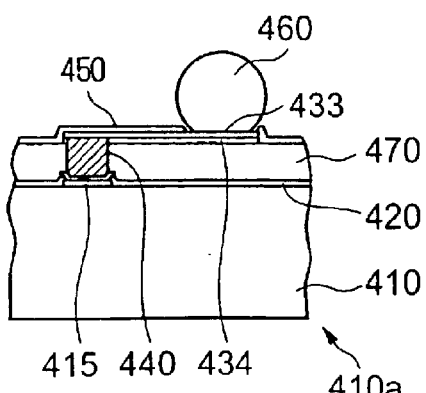

The solder balls 460 are attached to the layered structure consisting of the Ni layer 433b and the Au layer 433c as shown in FIG. 7H.

Subsequently, the wafer 410a is subjected to a dicing process to divide the wafer 410a into individual semiconductor IC chips 410 provided with the solder balls (outer terminals) 460, i.e., W-CSPs.

The W-CSP in the fourth embodiment is thus fabricated.

In the processes for forming the connecting terminals illustrated in FIGS. 6F and 6G and in the processes for forming the wiring lines and the connecting terminals illustrated in FIGS. 7E and 7F, a Cu layer may be formed by electroplating on the metal layer of the layered structure and the polished end surfaces of the conductive posts 440, and a plating resist film having openings corresponding to the conductive posts and terminal forming regions around the conductive post forming regions may be formed. Then, a Ni layer and a Au layer are formed in that order by plating, using the plating resist film as a mask, the plating resist film is removed, and parts of the Cu layer and the metal layer of the layered structure underlying the Cu layer are removed by etching to form the connecting terminals, or the wiring lines and the connecting terminals.

A semiconductor device fabricating method for fabricating the W-CSP in the third embodiment will briefly be described.

The semiconductor device fabricating method for fabricating the W-CSP in the third embodiment is similar to that for fabricating the W-CSP in the fourth embodiment, except that the former forms a layered structure of an insulating layer formed of an elastic material, a protective layer and a metal layer instead of the layered structure of the insulating layer formed of the elastic material and the metal layer, and bonds the insulating layer formed of the elastic material to the wafer by hot-melt lamination.

A semiconductor device fabricating method for fabricating the W-CSP in the second embodiment will briefly be described with reference to FIGS. 6 and 7.

The W-CSP in the second embodiment is fabricated by carrying out the processes illustrated in FIGS. 6A to 6F for fabricating the W-CSP in the first embodiment, and then carrying out the processes illustrated in FIGS. 7E to 7H for fabricating the W-CSP in the fourth embodiment.

Example 1

A W-CSP in Example 1 is analogous with the W-CSP in the first embodiment shown in FIG. 1 and formed by the semiconductor device fabricating method illustrated in FIG. 6.

The semiconductor device fabricating method will be described with reference to FIGS. 6A to 6H.

A wafer preparation process was carried out to obtain a wafer 110a carrying a plurality of semiconductor IC chips 110 and having a surface covered with a protective layer 120 formed by successively forming a SiN layer and a polyimide resin layer. The semiconductor IC chips 110 (FIG. 6A) were subjected to the following sequential wafer-level processes.

A metal layer 131 was formed on the protective layer (passivation film) 120 and electrode pads 115 as shown in FIG. 6B by depositing a 1000 Å thick Cr layer and a 5000 Å thick Cu layer in that order by sputtering. A resist film of a liquid resist (Tokyo Ouka) having a pattern with openings corresponding to wiring lines was formed on the metal layer 131. A 5 $\mu$m thick Cu layer was deposited by electroplating on parts of the surface of the metal layer 131, corresponding to the openings of the resist film, to form wiring lines. Then, the resist film was removed, and the Cr and Cu layer 131, excluding parts thereof forming wiring lines, was etched to form wiring layers 131 and 132 connected to the electrode pads 115 on the protective layer (passivation film) 120 as shown in FIG. 6C.

Then, a layered structure was formed by superposing a 100 $\mu$m thick insulating layer 170 of an adhesive, addition-polymerized silicone rubber, an 18 $\mu$m thick polyimide resin layer 150, and a 18 $\mu$m thick Cu foil 134 in that order from the wafer side, and the insulating layer 170 formed of the adhesive, elastic material was bonded to the wafer 110a by hot-melt lamination as shown in FIG. 6D.

The material forming the insulating layer 170 had an elastic modulus of 2 MPa and a breaking elongation of 250%.

Subsequently, parts of the Cu foil 134 of the layered structure, corresponding to conductive posts 140, were removed by etching using a ferric oxide solution as an etchant, and a resist film having openings corresponding to the conductive posts 140 as a mask. The resist film was removed after the completion of etching.

Then, blind vias 145 reaching the wiring layer consisting of the metal layers 131 and 132 on the protective layer (passivation film) 120 were formed through the insulating layer 170 and the protective layer 150 by using a $CO_2$ laser, and the interior of the blind vias 145 was cleaned by plasma etching or the like as shown in FIG. 6E.

Then, the blind vias 145 were filled up with an elastic, conductive paste to form posts, and the posts of the conductive paste were cured. Parts of the posts protruding from the surface of the metal layer 134 were ground and polished flat to complete conductive posts 140 as shown in FIG. 6F.

The elastic, conductive paste filled in the blind vias 145 was a silicone rubber paste containing 90% by weight Ag.

The conductive posts 140 had a volume resistivity of $3 \times 10^{-4} \Omega \cdot cm$ a breaking elongation of 80% and an elastic modulus of 4 MPa.

The end surfaces of the conductive posts 140 were polished with waterproof abrasive paper.

Subsequently, a plating resist film of a liquid resist having a pattern with openings corresponding to the conductive posts 140 formed by curing the conductive paste and outer terminal forming regions around the conductive posts 140 was formed on the metal layer of the layered structure. A 10 $\mu$m thick Ni layer and a 0.1 $\mu$m thick Au layer were formed in that order from the wafer side by electroplating using the plating resist film. Then, the plating resist film was removed, and parts of the metal layers of the layered structure were removed by etching, using the layered structure consisting of the Ni layer and the Au layer as an etching mask to form connecting terminals as shown in FIG. 6G.

Solder balls 160 of 0.25 mm in diameter were attached to the layered structure consisting of the Ni layer and the Au layer as shown in FIG. 6H.

Subsequently, the wafer 110a was subjected to a dicing process to divide the wafer 110a into individual semiconductor IC chips 110 provided with the solder balls, i.e., W-CSPs.

The 10 sq. mm W-CSP in Example 1 thus fabricated was mounted on a printed wiring board by soldering, and the W-CSP was subjected to a thermal shock test in which temperature was changed in the range of –55° C. to 150° C. Any terminals were not broken, and changes in the connection resistance of the terminals were 10% or below of the initial resistance of the terminals after 1000 high-low temperature cycles of the thermal shock test.

Thus, the semiconductor IC chip of the present invention and the solder balls are scarcely cracked when the semiconductor IC chip mounted on a wiring board is subjected to temperature changes. The semiconductor IC chip of the present invention can be manufactured at a low manufacturing cost.

What is claimed is:

1. A semiconductor device comprising:
   a semiconductor IC chip comprising a plurality of electrode pads, said pads each having a side;
   an insulating layer located on a surface of the semiconductor IC chip, on a surface of each of the electrode pads;
   a connecting terminal on an outer surface of the insulating layer; and
   a conductive post extending through the insulating layer and connecting the electrode pad of the semiconductor IC chip to the connecting terminal;
   wherein the insulating layer comprises an insulating elastic material and the conductive post comprises a conductive elastic material.

2. The semiconductor device according to claim 1, wherein
   the conductive post comprises a synthetic rubber and conductive particles dispersed in the synthetic rubber.

3. The semiconductor device according to claim 2, wherein
   the conductive elastic material of the conductive post comprises a composite paste comprising an addition-polymerized silicone rubber, and at least 70% by weight Ag particles dispersed in the addition-polymerized silicone rubber, and
   the composite paste when cured has a volume resistivity of not more than $5 \times 10^{-3}$ Ω·cm.

4. The semiconductor device according to claim 1, further comprising:
   a wiring layer located between an electrode pad of the semiconductor IC chip and the conductive post.

5. The semiconductor device according to claim 1, further comprising:
   a wiring part located between the connecting terminal and the conductive post.

6. The semiconductor device according to claim 1, wherein the connecting terminal is a solder ball.

7. The semiconductor device according to claim 6, further comprising:
   a barrier metal layer located between the solder ball and the conductive post.

8. The semiconductor device according to claim 1, wherein
   the insulating elastic material of the insulating layer is selected from the group consisting of silicone rubber, fluororubber, polyurethane rubber, polybutadiene rubber, acrylonitrile-butadiene copolymer and polyisoprene rubber, and has an elastic modulus of not more than 100 MPa.

9. The semiconductor device according to claim 1, further comprising:
   a protective layer on the outer surface of the insulating elastic material of the insulating layer, and
   the connecting terminal comprises a portion located at a position on the protective layer.

10. The semiconductor device according to claim 9, wherein
    the protective layer comprises a material selected from the group consisting of a polyimide resin, a liquid crystalline polymer and an epoxy solder resist.

11. The semiconductor device according to claim 1, comprising:
    a wafer-level chip-scale package produced by cutting a wafer into a plurality of semiconductor IC chips.

* * * * *